United States Patent [19]

Schaer et al.

[11] 4,323,441
[45] Apr. 6, 1982

[54] APPARATUS FOR ELECTROPLATING STRIP MATERIAL WITHOUT CURRENT LEAKAGE

[75] Inventors: Glenn R. Schaer, Columbus, Ohio; Tasuku Touyama; Teruaki Yamamoto, both of Shizuoka, Japan; Keisuke Honda; Tatsuo Wada, both of Shimizu, Japan

[73] Assignee: Koito Seisakusho Co. Ltd., Tokyo, Japan

[21] Appl. No.: 223,208

[22] Filed: Jan. 7, 1981

[30] Foreign Application Priority Data

Jan. 12, 1980 [JP] Japan .................... 55-2242

[51] Int. Cl.³ .............. C25D 5/02; C25D 5/08; C25D 7/06
[52] U.S. Cl. .................. 204/224 R; 204/15; 204/206
[58] Field of Search .......... 204/224 R, 15, DIG. 7, 204/206, 211

[56] References Cited

U.S. PATENT DOCUMENTS 4,030,999 6/1977 Allen .................... 204/224 R
4,119,516 10/1978 Yamaguchi ................ 204/224 R

*Primary Examiner*—T. M. Tufariello
*Attorney, Agent, or Firm*—George B. Oujevolk

[57] ABSTRACT

Apparatus for the production of metal foil or printed circuit patterns on a continuously advancing strip of electrically conductive material includes a cathode under which the conductive strip is fed in sliding contact therewith. An insoluble anode is disposed under the cathode, with an interelectrode gap between the anode and the cathodic conductive strip traveling under the cathode. Lying next to one end of the anode is a solution inlet block defining a solution inlet from which the electroplating solution containing the metal to be deposited is fed turbulently into the interelectrode gap to cause the electrodeposition of the metal on the downward-facing surface of the conductive strip. A shield block of electrically insulating material is mounted over the solution inlet block for shielding the conductive strip traveling thereover from premature metal deposition due to leaking current and hence for avoiding the development of pinholes in the metal foil or circuit patterns.

5 Claims, 3 Drawing Figures

APPARATUS FOR ELECTROPLATING STRIP MATERIAL WITHOUT CURRENT LEAKAGE

BACKGROUND OF THE INVENTION

1. Field of the Invention

Our invention relates to electroplating or electroforming apparatus, and more specifically to such apparatus for producing metal foil, for particular use in the manufacture of printed electronic circuitry, or printed circuit patterns by electrodepositing copper or other metal on a continuously advancing strip of electrically conductive material. Still more specifically our invention concerns improvements in or relating to continuous electroplating or electroforming apparatus of the type described and claimed in U.S. Pat. 4,119,516 issued on Oct. 10, 1978, to Seiichi Yamaguchi and assigned to the assignee of the instant application.

2. Description of the Prior Art

Among the more commonly used processes for the fabrication of printed circuitry is the etched-foil method. This conventional method employs a foil of metal such as copper bonded to a base of electrically insulating material. Over the copper foil is applied an etchant-resist mask in the shape of a desired circuit pattern. The masked copper foil is then placed in an etching solution capable of corroding copper, with the consequent dissolving of the unmasked regions of the copper foil. The etchant-resist mask is then removed by a solvent that attacks only the mask material, leaving the copper circuit pattern on the insulating base.

The manufacture of the metal foil to be processed into printed circuits as above is possible either by mechanical rolling or by electrodeposition. Mechanical rolling imposes limitations, by both technical and economic reasons, on the thickness and width of foil strips that can be produced. Rolled metal foil has a minimum thickness of as much as 35 microns, compared with 17 microns or less attained by electrodeposition. Electroforming of metal foil has therefore almost superseded mechanical rolling.

One well known electroplating apparatus for the production of metal foil employs a rotary drum as a cathode, on which the metal foil is electrodeposited. This conventional electroplating apparatus also has its own problem. Particularly when the metal is electrodeposited on the drum cathode to a thickness of 17 microns or less, the metal foil is easy to develop such imperfections as wrinkles, cracks and fissures while being stripped from the cathode on to a takeup roll. Thus, for the manufacture of metal foil as thin as 5 or 10 microns, for example, it has been customary to electrodeposit the metal on a foil carrier which is itself in the form of a foil of aluminum with a thickness of 40 to 60 microns. This practice is of course highly costly, necessitating wasteful use of aluminum.

The continuous electroplating apparatus of the aforesaid S. Yamaguchi U.S. Pat. No. 4,119,516 is a distinct improvement over the rotary drum-type apparatus as it makes the noted costly practice unnecessary. According to this prior patented apparatus, not only metal foil but also circuit patterns can be continuously electrodeposited on a strip of electrically conductive material traveling horizontally under and in sliding contact with a stationary cathode. It has later proved, however, that the horizontal electroplating apparatus tends to develop pinholes in metal foil or circuit patterns deposited on the conductive strip to a thickness of 17 microns or less. A brief account of this drawback follows.

The electroplating apparatus according to the mentioned U.S. Pat. has a pair of horizontally spaced, insoluble anodes disposed under the cathode, with an interelectrode gap between each anode and the conductive strip traveling under the cathode in sliding contact therewith. Lying between the pair of insoluble anodes is a block of electrically insulating material having formed therein an upwardly opening groove from which the electroplating solution is made to flow turbulently into and through the interelectrode gaps. Desired metal such as copper deposits on the downward-facing surface of the metal strip as same travels over the two insoluble anodes one after the other.

During electroplating operation the apparatus allows leakage of the electric current from the proper plating zones, in proportion to the size of the interelectrode gaps. The leaking current causes some deposition of the metal as coarse crystals on the successive downward-facing surface portions of the conductive strip just before they enter the plating zones.

Then, in the plating zones, the metal crystal tends to grow around the coarse deposits already existing on the conductive strip. The result is the production of pinholes in mesh-like arrangement unless the metal is deposited to a considerable thickness in the plating zones. Such pinholes are a crucial defect in metal foil or circuit patterns as thin as 17 microns or less.

SUMMARY OF THE INVENTION

It is an object of our invention to provide improved electroplating or electroforming apparatus capable of continuously producing extremely thin metal foil or circuit patterns without pinholes or other imperfections.

Another object of our invention is to provide a sealing unit, for use in the apparatus of the character described, that serves multiple purposes to improve the utility of the apparatus without correspondingly making its configuration complex or expensive.

In summary the apparatus according to our invention includes a cathode under which a strip of electrically conductive material to be electroplated is fed horizontally in sliding contact therewith and thereby made cathodic. An insoluble anode is disposed under the cathode, with an interelectrode gap between the anode and the conductive strip traveling under the cathode. Mounted next to the upstream end, with respect to a predetermined traveling direction of the conductive strip, of the insoluble anode is a solution inlet block having a solution inlet from which an electroplating solution containing the metal to be deposited is fed into the interelectrode gap so as to flow turbulently therethrough in the traveling direction of the conductive strip. The solution inlet has diffuser means for making constant in the transverse direction of the conductive strip the degree of turbulence of the electroplating solution flowing through the interelectrode gap. Also included is a shield block of electrically insulating material overlying the solution inlet block and shielding the conductive strip traveling thereover from premature deposition of the metal due to leaking current.

Employing the shield block located just upstream of the plating zone as in the foregoing, the apparatus according to our invention overcomes the drawback of the prior art explained previously, permitting continuous electrodeposition of the metal on the downward-facing surface of the conductive strip to a thickness of 17 microns or less without giving rise to pinholes or similar flaws.

In a preferred embodiment the shield block is molded integral with a pair of sealing bars, as a generally U-shaped sealing unit. The sealing bars are disposed on the opposite sides of the interelectrode gap for sealing the sides against the outflow of the electroplating solution. The shield block interconnects the sealing bars at their upstream ends. The entire sealing unit can be readily mounted in position to perform the above and additional functions to be detailed in the following description.

The above and other objects, features and advantages of our invention and the manner of attaining them will become more apparent, and the invention itself will best be understood, as the description proceeds, with reference had to the accompanying drawings showing a preferred embodiment of our invention.

DESCRIPTION OF THE PREFERRED EMBODIMENT

Figure 1:
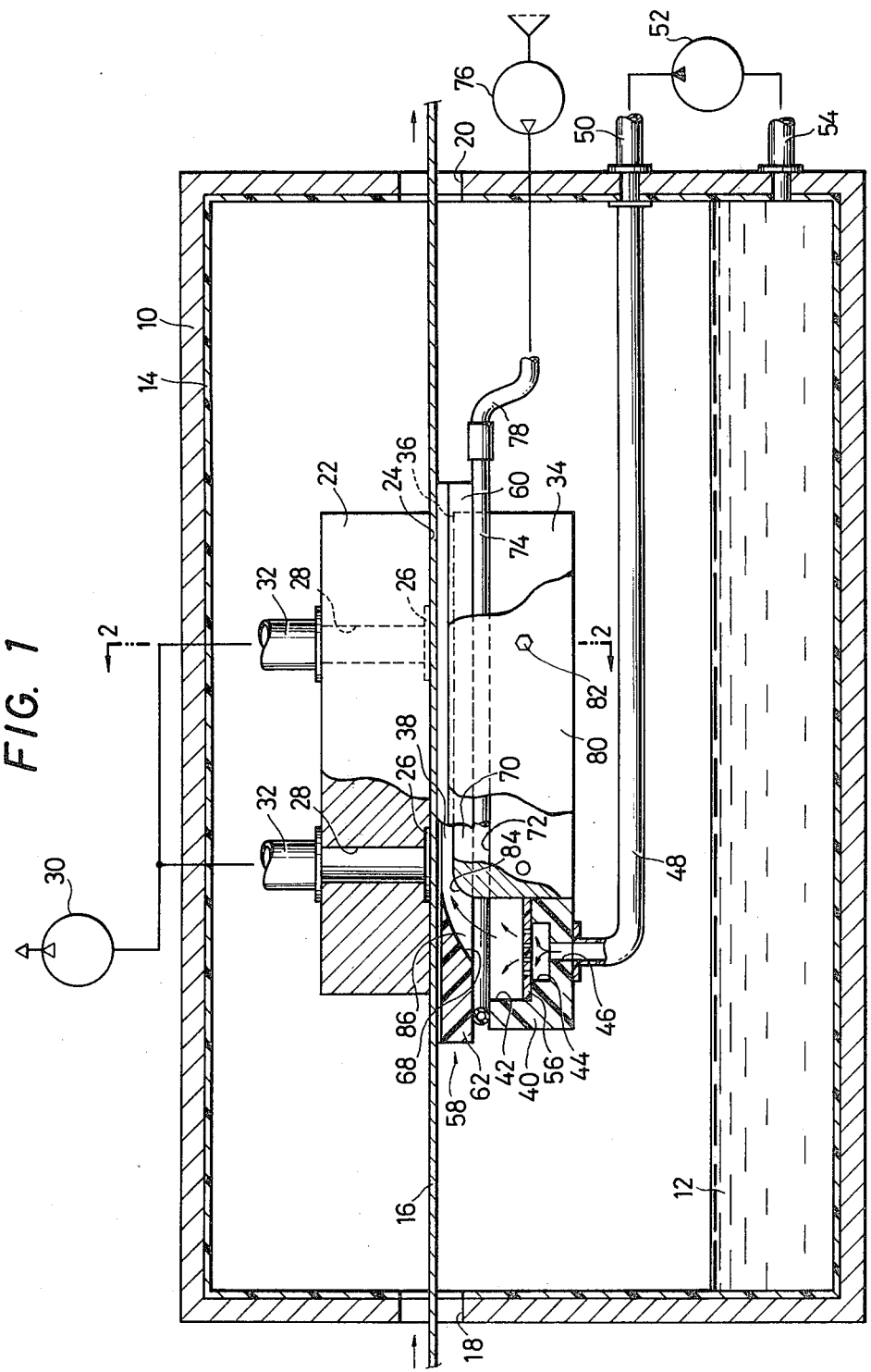
FIG. 1 is a vertical sectional view, partly in elevation and with parts broken away for clarity, of the electroplating or electroforming apparatus embodying our invention.

With particular reference to FIG. 1 the exemplified electroplating or electroforming apparatus includes a tank or vessel 10 containing, for example, an acid copper electroplating solution 12. The tank 10 is made of steel and, for use with the acid solution, has linings 14 of acid-resisting synthetic material such as polyvinyl chloride. A strip 16 of electrically conductive material, on which copper foil or circuit patterns are to be electrodeposited, passes horizontally through the tank 10 by entering same through an entrance opening 18 and leaving same through an exit opening 20.

Within the tank 10 there is fixedly mounted a cathode 22, as of graphite or copper, having a flat bottom surface 24 disposed horizontally. As will be seen also from FIG. 2, the bottom surface 24 of the cathode 22 has formed therein several depressions 26 communicating with respective passageways 28 formed vertically through the cathode. These passageways 28 communicate with a vacuum pump 30 via vacuum conduits 32.

The conductive strip 16 is to be fed under the cathode 22 from reel to reel (both not shown) in the arrow-marked direction. During such travel of the conductive strip 16 the vacuum pump 30 creates a partial vacuum in the depressions 26 in the bottom surface 24 of the cathode 22 thereby exerting suction on the conductive strip 16. In this manner the conductive strip 16 advances through the tank 10 in sliding contact with the bottom surface 24 of the cathode 22 and in sufficient electrical contact therewith to become cathodic.

Below the cathode 22 there is disposed an insoluble anode 34 having a flat top surface 36 oriented in parallel spaced relationship to the flat bottom surface 24 of the cathode 22. A suitable interelectrode gap 38 exists between insoluble anode 34 and cathodic conductive strip 16 traveling under the cathode 22. The insoluble anode 34 may be either of lead or lead-tin alloy or of titanium or copper having a thin cladding of platinum.

A solution inlet block 40 of electrically insulating material such as polyvinyl chloride is mounted next to one end of the insoluble anode 34 to provide an inlet from which the electroplating solution 12 is fed into the interelectrode gap 38 so as to flow turbulently therethrough. Said one end of the insoluble anode 34 can be thought of as the upstream end with respect to the predetermined traveling direction of the conductive strip 16 and will hereafter be referred to as such.

The solution inlet block 40 is recessed to define, in combination with the insoluble anode 34, a groove or channel 42 generally extending transversely of the conductive strip 16. The solution inlet block 40 has formed therein another groove or channel 44 of smaller width lying under the first mentioned groove 42 and also extending transversely of the conductive strip 16. The first 42 and second 44 grooves serve in combination as the noted inlet from which the electroplating solution 12 is fed into the interelectrode gap 38.

Extending downwardly from the midpoint of the second groove 44 with respect to its longitudinal dimension is a solution passageway 46 communicating via a solution feed conduit 48 with the outlet conduit 50 of a pump 52 located external to the tank 10. The pump 52 has an inlet conduit 54 communicating with the interior of the tank 10 at a point below the level of the electroplating solution 12 contained therein. Thus the solution is constantly pumped into the solution inlet block 40.

A diffuser plate 56 is secured to the solution inlet block 40 in any convenient manner so as to divide the first 42 and second 44 grooves therein. This diffuser plate has formed therein an array of perforations for the passage of the electroplating solution therethrough. The function of the diffuser plate 56 will become apparent as the description progresses.

As seen in both FIGS. 1 and 2 and shown on an enlarged scale in FIG. 3, a sealing unit 58 is disposed between cathode 22 and anode 34 for several purposes hereinafter set forth. The sealing unit 58 is generally U-shaped, comprising a pair of parallel spaced sealing bars 60 extending along and disposed on opposite sides of the interelectrode gap 38, and a shield block or plate 62 bridging the sealing bars at their upstream ends. The entire sealing unit 58 is integrally molded of electrically insulating, wear-and chemical-resisting material such as, preferably, Teflon (trade mark for tetrafluoroethylene fluorocarbon polymers).

The pair of sealing bars 60 of the sealing unit 58 have their top edges 64 rounded for sliding but practically fluid-tight contact with the opposite side end portions of the downward-facing surface of the conductive strip 16. The shield block 62 of the sealing unit 58 has an exactly planar top surface 66, which is ever so slightly lower than the crests of the rounded top edges 64 of the sealing bars 60. The downstream end surface 68 of the shield block 62 is curved into the shape best depicted in FIG. 1.

The insoluble anode 34 has its top end portion 70 reduced in width to provide a pair of horizontal mounting ledges 72 on its opposite sides. As will be noted from FIG. 1, these mounting ledges 72 are in coplanar relationship to the U-shaped top surface of the solution inlet block 40. Placed on and extending along the pair of mounting ledges 72 of the anode 34 and the U-shaped top surface of the solution inlet block 40 is a lifter tube 74 of elastic material such as a synthetic rubber. The lifter tube 74 is bent into the shape of the letter U, as shown in FIG. 3, and on this lifter tube rests the U-shaped sealing unit 58.

Figure 2:
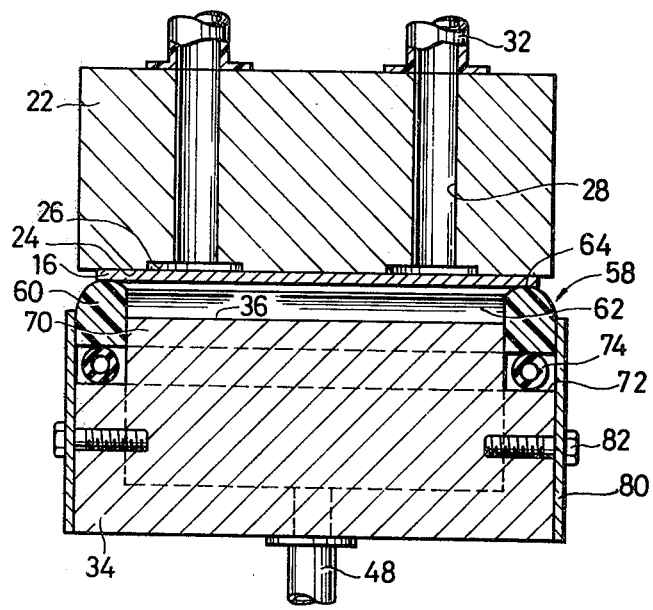
FIG. 2 is an enlarged vertical sectional view taken along the line 2—2 of FIG. 1.
Figure 3:
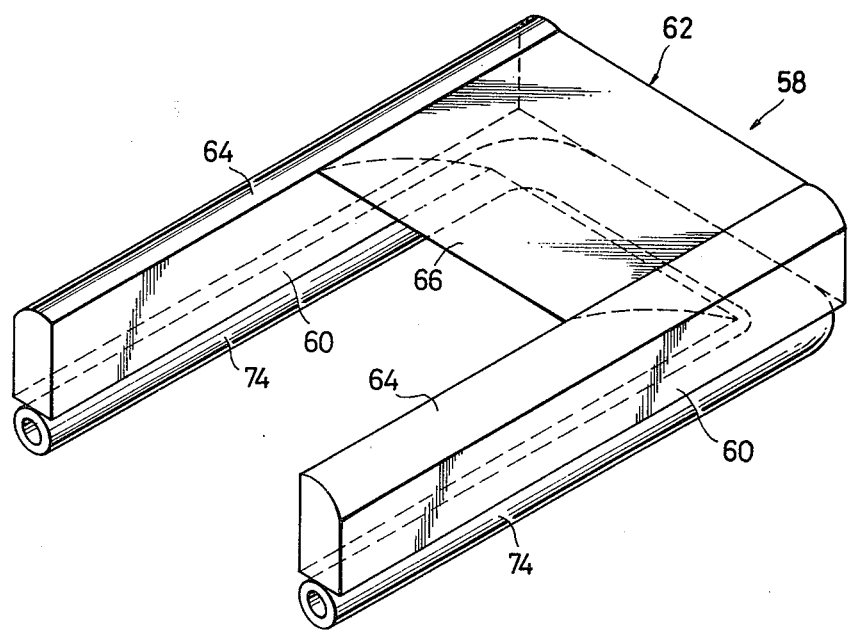
FIG. 3 is an enlarged perspective view of the sealing unit used in the apparatus of FIG. 1, the view also showing a lifter tube under the sealing unit.

Thus, as best seen in FIG. 2, the pair of sealing bars 60 of the sealing unit 58 are disposed on opposite sides of the narrower top end portion 70 of the insoluble anode 34, making sliding contact therewith. The shield block 62 of the sealing unit 58 lies mostly over the solution inlet block 40.

The lifter tube 74 is in communication with a compressor 76 via an air conduit 78. Upon delivery of pressurized air from the compressor 76 into the lifter tube 74, the latter increases in diameter thereby raising the sealing unit 58. A pair of rectangular plates 80 are secured, as by capscrews 82, to the opposite sides of the anode 34 and solution inlet block 40 in order to retain the lifter tube 74 in position and to guide the up-and-down motion of the sealing unit 58.

When lifted by the lifter tube 74, the sealing unit 58 has the rounded top edges 64 of its sealing bars 60 urged into sliding contact with the opposite side end portions of the downward-facing surface of the conductive strip 16. The pair of sealing bars 60 thus bound and seal the lateral ends of the interelectrode gap 38, causing the electroplating solution to flow through the interelectrode gap only in the longitudinal direction of the conductive strip 16.

The shield block 62 of the sealing unit 58 partly underlies the cathode 22 and partly overhangs the insoluble anode 34 in order to shield the successive portions of the conductive strip 16 going to enter the interelectrode gap 38. The shield block 62 thus prevents premature electrodeposition of copper on such conductive strip portions due to current leakage.

Although the shield block 62 must shield the conductive strip 16 from leaking current, its planar top surface 66 should not contact the surface of the conductive strip or a patterned plating-resist mask thereon because the shield block may somehow contaminate the conductive strip surface or damage the plating-resist mask. An attainment of these contradictory requirements is possible by providing a spacing of not more than about 0.1 millimeter between the top surface 66 of the shield block 62 and the surface of the conductive strip 16 when the rounded top edges 64 of the sealing bars 60 are in proper sliding contact with the conductive strip.

A consideration of FIG. 1 will reveal that the aforesaid curved downstream end surface 68 of the shield block 62 is disposed opposite to the top edge 84 of the upstream end of the insoluble anode 34. This edge 84 is rounded and coacts with the curved downstream end surface 68 of the shield block 62 to define a curved passageway 86 for directing the electroplating solution from the inlet groove 42 to the interelectrode gap 38.

As will be evident from the foregoing, the sealing unit 58 performs the multiple function of: (1) sealing the lateral ends of the interelectrode gap 38 against the outflow of the electroplating solution; (2) shielding the conductive strip 16 from leaking current; and (3) providing, in combination with the insoluble anode 34, the curved passageway 86 for the electroplating solution from the inlet groove 42 to the interelectrode gap 38. The term "sealing unit" represents, therefore, only one of its intended functions.

OPERATION

For the continuous fabrication of copper foil or circuit patterns by the apparatus of the above described construction, the conductive strip 16 is fed at constant speed in the arrow-marked direction (rightward as viewed in FIG. 1) through the apparatus. The downward-facing surface of the conductive strip 16 must previously be masked with a plating resist for the production of printed circuit patterns and can be blank for foil production. The vacuum pump 30 is set in motion to exert suction on the conductive strip 16 through the depressions 26 in the bottom surface 24 of the cathode 22, with the result that the advancing conductive strip is maintained in sliding contact with the cathode 22 and thereby made cathodic.

The pump 52 is also set in motion to cause the electroplating solution 12 to flow turbulently through the interelectrode gap 38 between cathodic conductive strip 16 and insoluble anode 34. The degree of turbulence of the solution flowing through the interelectrode gap 38 must be constant in the direction transverse to the conductive strip 16. It is toward this end that the diffuser plate 56 is interposed between the first 42 and second 44 grooves in the solution inlet block 40.

Pumped into the solution inlet block 40, the electroplating solution first fills the inlet groove 44 and then passes the perforated diffuser plate 56 into the other inlet groove 42. Thence the solution flows through the curved passageway 86 into the interelectrode gap 38. The curved passageway 86 also helps to make constant in the transverse direction the degree of turbulence of the solution flowing through the interelectrode gap 38. The pair of sealing bars 60 of the sealing unit 58 constrains the flow of the solution only in the longitudinal direction of the conductive strip 16.

Although the electrical details of the apparatus are not illustrated because of their rather common and well-known nature, it is understood that direct current is introduced through the insoluble anode 34, at a current density of up to about three amperes per square centimeter. Copper is electrodeposited from the solution on the downward-facing surface of the conductive strip 16 traveling under the cathode 22. The solution flowing turbulently through the interelectrode gap 38 is effective to prevent any undue decrease in copper ion concentration in the adjacency of the surface of the conductive strip 16 and hence to speed the electrodeposition of copper thereon.

The shield block 62 of the sealing unit 58 prevents premature copper deposition, due to leaking current, on the conductive strip 16 traveling thereover, permitting the electroplating of the conductive strip only when same enters the proper plating zone. Copper foil or circuit patterns as thin as 17 microns or less can thus be formed continuously on the conductive strip 16 without pinholes or other flaws.

While we have herein shown and described our invention in what we have conceived to be the most practical and preferable embodiment, it is recognized that this embodiment is susceptible to a variety of modifications or changes within the broad teaching hereof. It is further understood that our invention is applicable to the electrodeposition of metals other than copper, such as nickel and cobalt, and of alloys such as nickel-cobalt alloy. Our invention is therefore not to be limited to the details disclosed herein but is to be accorded the full scope of the appended claims so as to embrace any and all equivalent forms.

We claim:

1. An apparatus for electroplating a strip of electrically conductive material being fed through the apparatus in a predetermined direction, comprising:
   (a) a hollow vessel for receiving an electroplating solution containing a metal to be electrodeposited;
   (b) a cathode mounted in the vessel and having a bottom surface disposed horizontally, the conductive strip being fed in sliding contact with the bottom surface of the cathode and being thereby made cathodic;
   (c) an insoluble anode mounted under the cathode, there being an interelectrode gap between the insoluble anode and the conductive strip traveling under the cathode;
   (d) inlet means in said vessel defining a solution inlet from which the electroplating solution is fed into the interelectrode gap so as to flow turbulently therethrough in the predetermined traveling direction of the conductive strip;
   (e) turbulence creating means for making constant in the transverse direction of the conductive strip the degree of turbulence of the electroplating solution flowing through the interelectrode gap;
   (f) a pair of sealing bars of electrically insulating material for sealing the opposite sides of the interelectrode gap against the outflow of the electroplating solution; and,
   (g) a shield block bridging the pair of sealing bars and molded integral therewith, the shield block being disposed over the inlet means so as to shield the conductive strip traveling over the shield block from premature deposition of the metal due to current leakage.

2. An apparatus as claimed in claim 1, further comprising urging means for urging the pair of sealing bars into sliding but practically fluid-tight contact with the conductive strip.

3. An apparatus as claimed in claim 2, wherein the urging means comprises a lifter tube of elastic material for receiving a fluid under pressure.

4. An apparatus as claimed in claim 2, wherein said pair of sealing bars have a top edge and the shield block has a planar top surface disposed slightly lower than said top edges of the pair of sealing bars, whereby a slight spacing exists between the shield block and the conductive strip when the sealing bars are urged into proper contact with the conductive strip.

5. An apparatus as claimed in claim 1, wherein the insoluble anode and the shield block are so constructed and adapted as to define in combination a curved passageway for directing the electroplating solution from the solution inlet to the interelectrode gap.

* * * * *